US006820686B2

(12) United States Patent
Yang et al.

(10) Patent No.: US 6,820,686 B2
(45) Date of Patent: Nov. 23, 2004

(54) HEAT-DISSIPATING CASING OF ELECTRONIC APPARATUS

(75) Inventors: I-Jung Yang, Taipei (TW); Shich-Ching Chu, Taipei (TW); Hsi-An Liu, Taipei (TW)

(73) Assignee: Delta Electronics, Inc., Taipei (TW)

( * ) Notice: Subject to any disclaimer, the term of this patent is extended or adjusted under 35 U.S.C. 154(b) by 0 days.

(21) Appl. No.: 10/434,208

(22) Filed: May 9, 2003

(65) Prior Publication Data

US 2004/0144527 A1 Jul. 29, 2004

(30) Foreign Application Priority Data

Jan. 24, 2003 (TW) ........................................ 92201318 U

(51) Int. Cl.[7] ................................................. F28F 7/00
(52) U.S. Cl. ........................ 165/185; 165/75; 361/831; 361/704; 361/697
(58) Field of Search ........................ 165/80.3, 185, 165/72, 73; 361/697, 704, 724; 257/706, 722; 174/16.3

(56) References Cited

U.S. PATENT DOCUMENTS

| | | | |
|---|---|---|---|
| 4,383,286 A | * 5/1983 | Hicks ........................ 361/695 |
| 5,086,509 A | * 2/1992 | Inubushi et al. ......... 455/575.8 |
| 5,612,852 A | * 3/1997 | Leverault et al. ........... 361/687 |
| 5,725,622 A | * 3/1998 | Whitson et al. ........... 55/385.4 |
| 5,828,034 A | * 10/1998 | Chang ........................ 219/209 |
| 5,831,847 A | * 11/1998 | Love ........................... 363/141 |
| 5,870,284 A | * 2/1999 | Stewart et al. .............. 361/699 |
| 5,898,569 A | * 4/1999 | Bhatia ........................ 361/700 |
| 6,028,769 A | * 2/2000 | Zurek ......................... 361/704 |
| 6,307,746 B1 | * 10/2001 | Beckman ..................... 361/687 |
| 6,411,514 B1 | * 6/2002 | Hussaini ..................... 361/704 |
| 6,459,575 B1 | * 10/2002 | Esterberg .................... 361/687 |
| 6,547,001 B2 | * 4/2003 | McCullough et al. ....... 165/185 |

* cited by examiner

Primary Examiner—Terrell McKinnon
(74) Attorney, Agent, or Firm—Bacon & Thomas

(57) ABSTRACT

A heat-dissipating casing of an electronic apparatus having an input device, an output device, and a printed circuit board connected with the input device and the output device is disclosed. The heat-dissipating casing includes a metal extruded casing having at least four surfaces to form a space, a first opening and a second opening, wherein the space is used for receiving the printed circuit board, a first side plate fixed to the metal extruded casing to cover the first opening and having a first hole for securing the input device, and a second side plate fixed to the metal extruded casing to cover the second opening and having a second hole for securing the output device, thereby dissipating the heat generated from the electronic apparatus and equalizing the surface temperature of the electronic apparatus.

15 Claims, 5 Drawing Sheets

HEAT-DISSIPATING CASING OF ELECTRONIC APPARATUS

FIELD OF THE INVENTION

This invention relates to a heat-dissipating casing of an electronic apparatus, and more particularly to a heat-dissipating casing of an adapter or a power supply, which has effects of heat-dissipation, temperature-equalization and scald-prevention.

BACKGROUND OF THE INVENTION

The adapter and the power supply are electronic apparatuses used frequently in our daily life. Taking the adapter as an example, it is generally employed for rectifying and converting the external AC power into the DC power, so as to supply the required power to an electric appliance, such as a notebook, or charge the charging battery.

Please refer to FIG. 1, which shows the casing of the conventional adapter. The casing of the conventional adapter 1 includes an upper casing 11 and a lower casing 12, in which the upper casing 11 and the lower casing 12 can be engaged with each other, and a space is provided between the upper casing 11 and the lower casing 12 for receiving a printed circuit board 13. When the upper casing 11 and the lower casing 12 are engaged with each other, a first opening and a second opening are formed on the opposite surfaces of the assembled casing for fixing a socket 14 and a power cord 15 therein, respectively. The socket 14 and the power cord 15 can be electrically connected with the printed circuit board 13, respectively, thereby the external power can be provided to the printed circuit board 13 through the socket 14, and the power converted by the printed circuit board 13 can be provided to the electric appliance for usage through the power cord 15.

With the integration of the integrated circuit, the volume of the electronic apparatus is also decreased, which results in the difficulty of heat-dissipation. A large amount of heat is usually generated from the electronic elements on the printed circuit board during the operation of the adapter. However, the upper and lower casings of the conventional adapter are made of plastic, and obviously, the heat is hard to dissipate and would accumulate in the interior of the adapter since the plastic has low heat-conductance coefficient. If the heat accumulated within the adapter cannot be dissipated efficiently, the electronic elements in the adapter will be damaged easily, and thus, not only the lifespan but also the power converting efficiency of the adapter will be decreased significantly.

For overcoming the problem of heat-dissipation, an adapter as shown in FIG. 2 is provided in the market, which has plural heat-dissipating holes 20 formed on the upper and lower casings. However, via the design of the heat-dissipating holes 20, the heat in the adapter can only be dissipated by convection due to the temperature difference between the interior and the exterior of the adapter, and the heat-dissipating effect thereof is not good enough. In addition, another type of adapter is provided in the market, which has a small heat-dissipating fan and wind exits for driving out the heat accumulated in the interior of the adapter. However, such design limits the miniaturization of the adapter, and the heat in the adapter cannot be evenly dissipated by the heat-dissipating fan, so that the temperature of the adapter cannot be equalized, and thus the heat accumulated in the dead space for heat-dissipation may cause damages to the neighboring electronic elements.

Furthermore, for the user of the portable notebook, since the adapter becomes hot after it is used for a period of time, the user may be scalded when touching the adapter. Therefore, to overcome the disadvantages of the prior art described above, it is needed to provide a heat-dissipating casing of an electronic apparatus which has effects of heat-dissipation, temperature-equalization and scald-prevention.

SUMMARY OF THE INVENTION

It is an object of the present invention to provide a heat-dissipating casing of an electronic apparatus to overcome the heat-dissipation problem of the conventional electronic apparatus, and equalize the temperatures of the casing and the interior of the electronic apparatus.

It is another object of the present invention to provide a heat-dissipating casing of an electronic apparatus to prevent a user from being scalded when touching the electronic apparatus which is used for a period of time.

In accordance with an aspect of the present invention, a heat-dissipating casing of an electronic apparatus having an input device, an output device, and a printed circuit board connected with the input device and the output device is disclosed. The heat-dissipating casing includes a metal extruded casing having at least four surfaces to form a space, a first opening and a second opening, wherein the space is used for receiving the printed circuit board, a first side plate fixed to the metal extruded casing to cover the first opening and having a first hole for securing the input device, and a second side plate fixed to the metal extruded casing to cover the second opening and having a second hole for securing the output device, thereby dissipating the heat generated from the electronic apparatus and equalizing the surface temperature of the electronic apparatus.

In accordance with another aspect of the present invention, a heat-dissipating casing of an electronic apparatus having an input device, an output device, and a printed circuit board connected with the input device and the output device is disclosed. The heat-dissipating casing includes a metal extruded casing having at least four surfaces to form a space, a first opening and a second opening, wherein the space is used for receiving the printed circuit board, a first side plate fixed to the metal extruded casing to cover the first opening and having a first hole for securing the input device, a second side plate fixed to the metal extruded casing to cover the second opening and having a second hole for securing the output device, and at least one cover covering a part of the metal extruded casing for preventing a user from directly touching the electronic apparatus and being hurt by the heat generated from the electronic apparatus.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

The present invention relates to a heat-dissipating casing of an electronic apparatus. The present techniques are illustrated with the following embodiments for a heat-dissipating casing of an adapter, but the electronic apparatus which is applicable to the present techniques is not limited to the adapter. Any electronic apparatus which is applicable to the following techniques, such as a power supply, a charger and a transformer, is incorporated herein for reference.

The adapter of the present invention mainly includes a heat-dissipating casing, a circuit board, an input device and an output device. In a preferred embodiment of the present invention, the input device can be a plug, a socket or a power cord, and the output device can also be a plug, a socket or a power cord, which is determined according to what the input device is. For the convenience of description, the following embodiments are illustrated with an adapter having a socket as the input device and a power cord as the output device, in which the socket can be connected to a plug of a power cord for inputting the commercially available power, and the adapter can output the converted power to an information equipment, such as a notebook, via the output device of the power cord.

Figure 1:
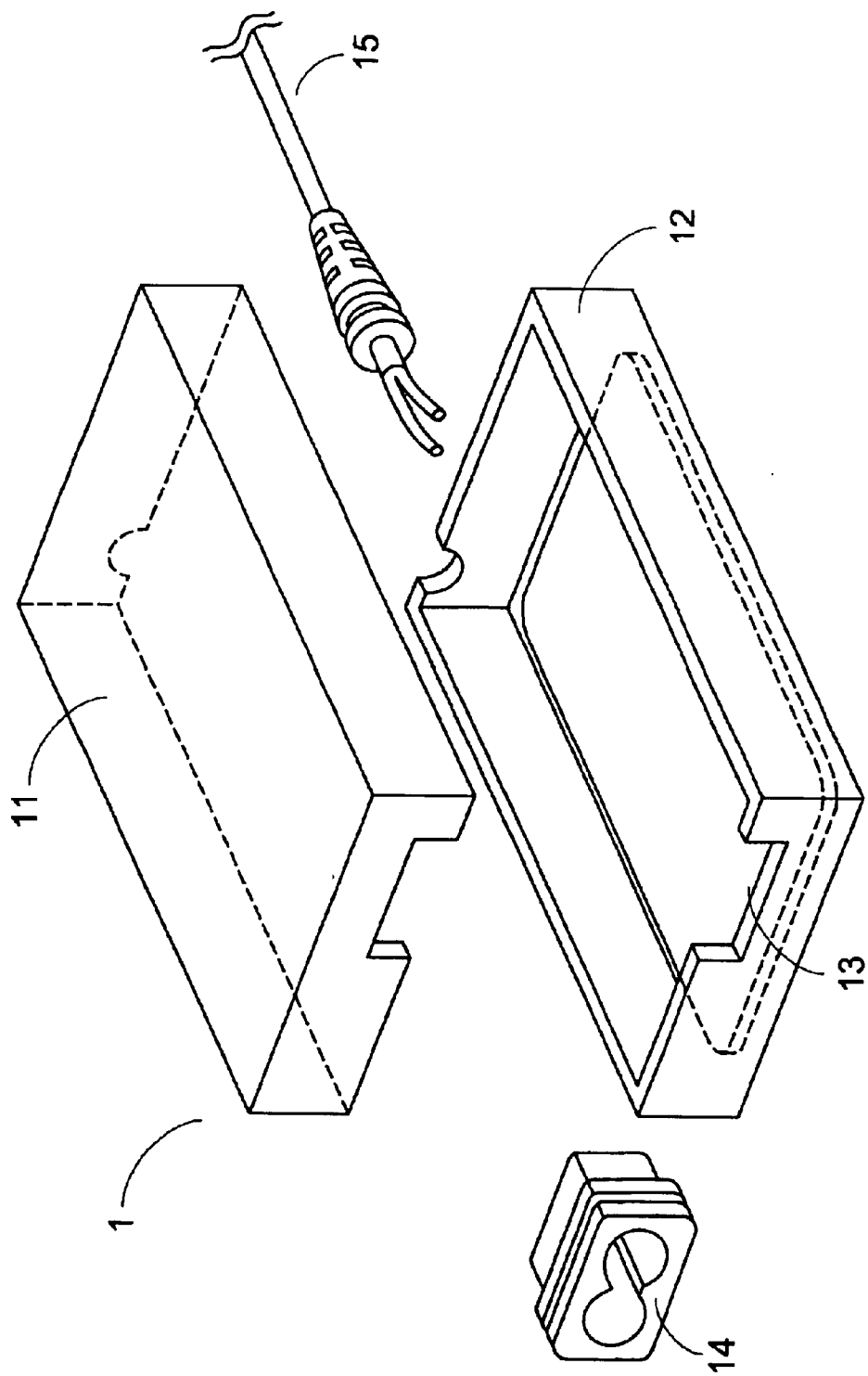
FIG. 1 is a schematic view showing the casing of the conventional adapter.
Figure 2:
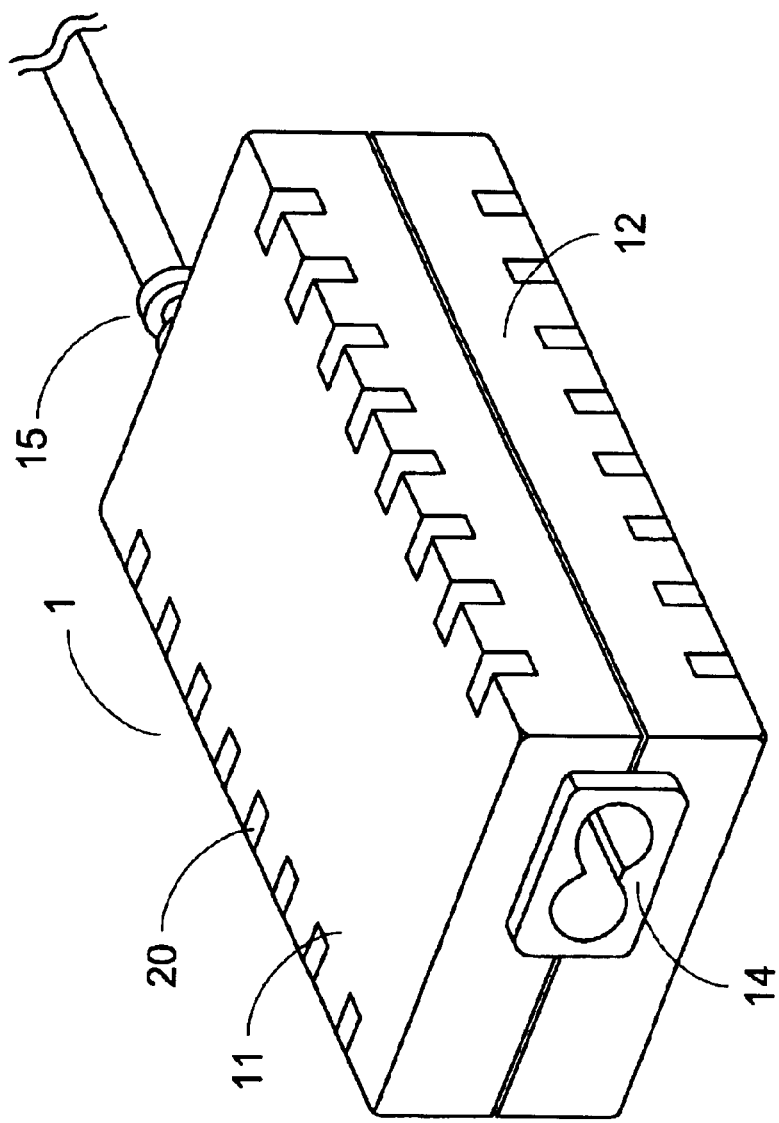
FIG. 2 is a schematic view showing the heat-dissipating casing of the conventional adapter which has heat-dissipating holes.
Figure 3:
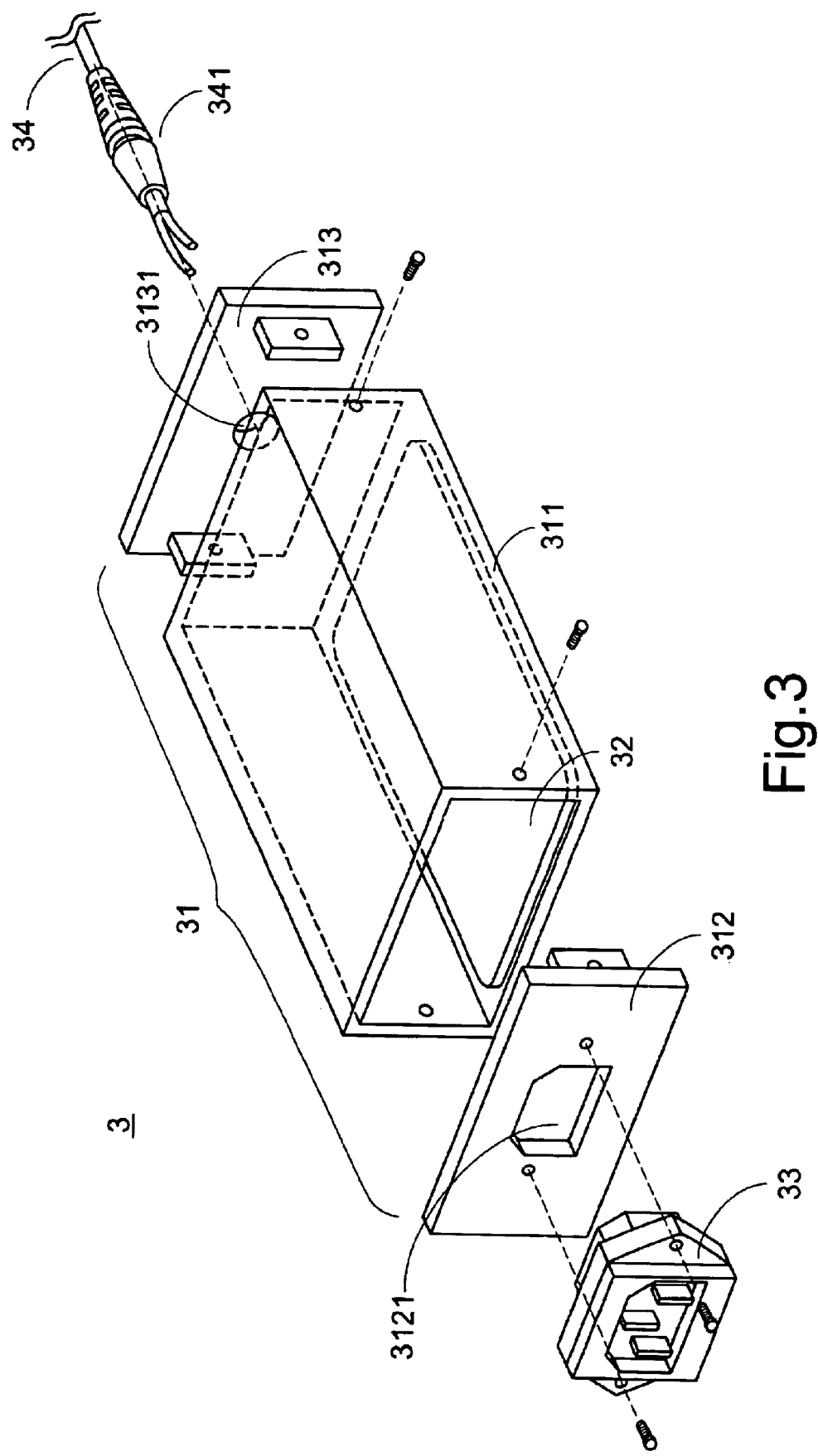
FIG. 3 is a schematic view showing the heat-dissipating casing of the adapter according to a preferred embodiment of the present invention.
Figure 4:
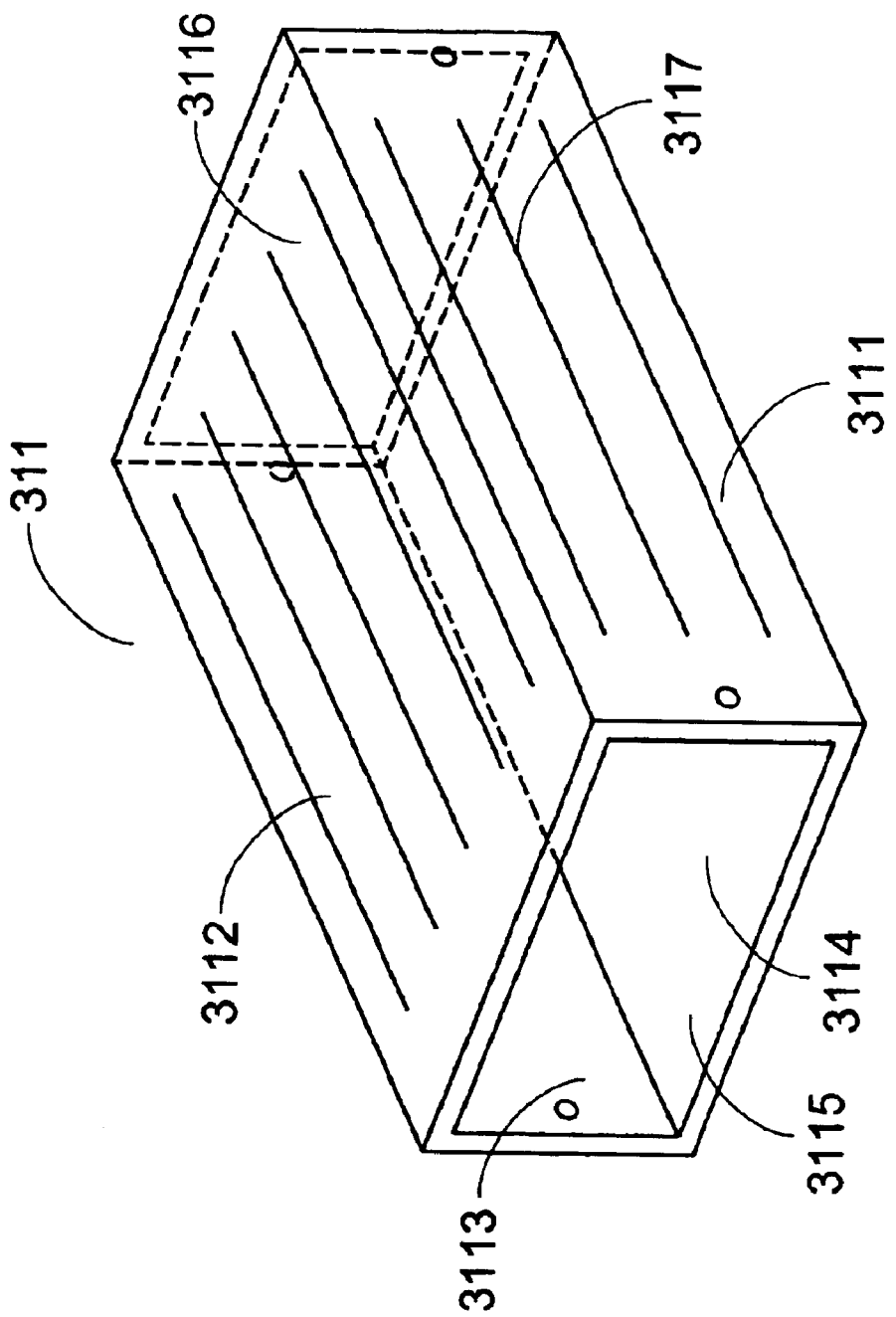
FIG. 4 is a schematic view showing the metal extruded casing in FIG. 3.

Please refer to FIG. 3 which is a schematic view showing the heat-dissipating casing of the adapter according to a preferred embodiment of the present invention. As shown in FIG. 3, the heat-dissipating casing 31 includes a metal extruded casing 311 (i.e. Al enclosure), a first side plate 312 and a second side plate 313. The metal extruded casing 311 can be made of aluminum or copper, which is a metal material having high heat-conductance coefficient. The first side plate 312 and the second side plate 313 are made of aluminum, copper or plastic. Please refer to FIG. 4 which is a schematic view showing the metal extruded casing in FIG. 3. As shown in FIG. 4, the metal extruded casing 311 is an integrally formed aluminum or copper extruded casing. The metal extruded casing 311 has four surfaces 3111, 3112, 3113, 3114 to form a space therein for receiving the printed circuit board 32. In addition, a first opening 3115 and a second opening 3116 are formed respectively by the edges of the four surfaces.

Please also refer to FIG. 3. The first side plate 312 has a first hole 3121 for fixing a socket 33 therein. In this embodiment, the socket 33 can be further fixed to the first side plate 312 by screws. Of course, other fixing manners which can be practiced accordingly, such as engagement, are also incorporated herein for reference. In addition, the first side plate 312 can also be fixed to the metal extruded casing 311 by screws, so as to cover the first opening 3115 tightly. Of course, other fixing manners which can be practiced accordingly, such as engagement, are also incorporated herein for reference.

Similarly, the second side plate 313 has a second hole 3131 for fixing a terminal 341 of a power cord 34 therein. In this embodiment, the terminal 341 of the power cord 34 is fixed to the second side plate 313 by engagement. Of course, other fixing manners which can be practiced accordingly are also incorporated herein for reference. In addition, the second side plate 313 can be fixed to the metal extruded casing 311 by screws, so as to cover the second opening 3116 tightly. Of course, other fixing manners which can be practiced accordingly, such as engagement, are also incorporated herein for reference.

Obviously, the contact area of the interior of the adapter 3 to the external environment can be increased via the metal extruded casing 311 of the heat-dissipating casing, and the heat generated from the operating electronic elements on the printed circuit board 32 in the interior of the adapter 3 can be efficiently and evenly conducted out. Therefore, the temperatures of the casing and the interior of the adapter 3 can be equalized substantially, which is an effect cannot be achieved by the commercially available adapters at present.

Please refer to FIG. 4 again. Plural dents or fins can be selectively formed on the four surfaces 3111, 3112, 3113, 3114 of the metal extruded casing 311. Thereby, the heat-dissipating area of the metal extruded casing 311 can be increased, so that the heat generated from the operating electronic elements on the printed circuit board 32 can be conducted out more efficiently, rapidly and evenly. In addition, plural heat-dissipating holes (not shown) can be selectively formed on the metal extruded casing 311 to increase the heat-dissipating effect by convection.

Figure 5:
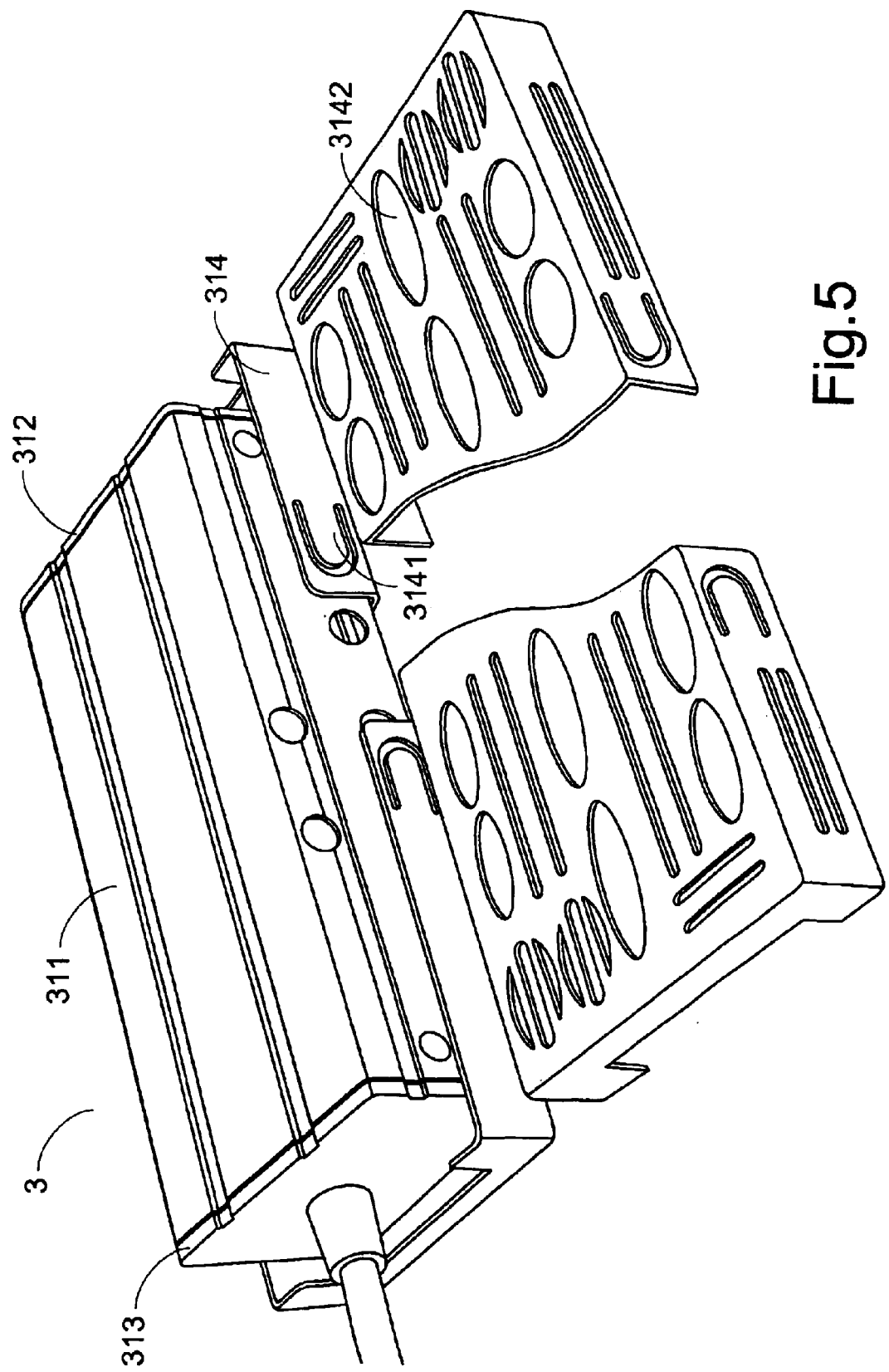
FIG. 5 is a schematic view showing the heat-dissipating casing of the adapter according to another preferred embodiment of the present invention, in which the heat-dissipating casing includes at least one cover.

Furthermore, in the above-described embodiments, at least one cover 314 can be provided additionally for the heat-dissipating casing 31 to partially cover the metal extruded casing 311 as shown in FIG. 5. The provision of the cover 314 can protect the metal extruded casing 311 from the deformation due to collision or falling to the ground, increase the aesthetic feeling, and prevent a user from directly touching the adapter 3 and being hurt by the heat generated from the adapter 3. A specific space can be generated between the adapter 3 and the contact table thereof via the provision of the cover 314, so that the heat in the metal extruded casing 311 can be conducted out successfully through each surface thereof. While in the prior art, the adapter contacts with the table directly, so the heat-dissipating effect of the contact surface is not good. Therefore, the heat-dissipating effect of the metal extruded casing 311 can be improved by the design of the cover 314 in the present invention.

Please also refer to FIG. 5. In this embodiment, the heat-dissipating casing of the present invention further includes four covers 314, each of which covers a portion of the metal extruded casing 311. The cover 314 has at least one fixing element 3141 for biasing against the surface of the metal extruded casing 311, so that the cover 314 can be fixed to the metal extruded casing 311 in a removable manner, i.e. can be easily assembled and disassembled. The fixing element 3141 is preferably a spring piece in this embodiment. Of course, other engaging or fixing manners which can be practiced accordingly are also incorporated herein for reference. In addition, the number of the covers is not limited to four. For example, two covers may be provided as an upper cover and a lower cover (not shown) for covering the upper portion and the lower portion of the metal extruded casing 311, respectively. Moreover, plural heat-dissipating holes 3142 can be formed on each cover 314 to increase heat-dissipating efficiency of the metal extruded casing 311.

In conclusion, the design of the metal extruded casing in the present invention can increase the surface area for heat-dissipation, so that the adapter can have a better heat-dissipating efficiency. In addition, since the aluminum or copper, which is the material of the metal extruded casing, has high heat-conductance coefficient, the casing temperature of the adapter can be equalized. Moreover, the aluminum extruded casing is formed by heating the aluminum (or alloys thereof) to a plastic temperature (about 400° C. to 500° C.), and then extruding the aluminum to pass through a mold by pressure on an extruder. Therefore, the manufacturing process of the aluminum extruded casing is quite simple, and so is that of the copper extruded casing. Furthermore, at least one cover is provided for the heat-dissipating casing of the present invention, which can protect the metal extruded casing from the deformation due to collision or falling to the ground, increase the aesthetic feeling, and prevent a user from directly touching the adapter and being hurt by the heat generated from the adapter. Thus, the present invention overcomes the disadvantages of the prior art and possesses the industrial value.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A heat-dissipating casing of an electronic apparatus having an input device and said output device, comprising:
   a metal extruded casing having at least four surfaces to form a space, a first opening and a second opening, wherein said space is provided for receiving said printed circuit board;
   a first side plate fixed to said metal extruded casing to cover said first opening and having a first hole for securing said input device;
   a second side plate fixed to said metal extruded casing to cover said second opening and having a second hole for securing said output device; and
   at least one cover covering a part of said metal extruded casing, said cover having at least one fixing element for fixing to said metal extruded casing in a removable manner, said fixing element is a spring piece for biasing against said surface of said metal extruded casing, thereby dissipating the heat generated from said electronic apparatus and equalizing the surface temperature of said electronic apparatus.

2. The heat-dissipating casing according to claim 1 wherein said electronic apparatus is an adapter, a power supply or a transformer.

3. The heat-dissipating casing according to claim 1 wherein said metal extruded casing is made of aluminum or copper.

4. The heat-dissipating casing according to claim 1 wherein said metal extruded casing is formed integrally.

5. The heat-dissipating casing according to claim 1 wherein said metal extruded casing has plural dents or fins formed on said surfaces thereof.

6. The heat-dissipating casing according to claim 1 wherein said metal extruded casing has plural heat-dissipating holes.

7. The heat-dissipating casing according to claim 1 wherein said cover is made of plastic.

8. The heat-dissipating casing according to claim 1 wherein said cover has plural heat-dissipating holes.

9. The heat-dissipating casing according to claim 1 wherein said first side plate and said second side plate are made of aluminum, copper or plastic.

10. The heat-dissipating casing according to claim 1 wherein said first side plate is fixed to said metal extruded casing to cover said first opening by screws.

11. The heat-dissipating casing according to claim 1 wherein said second side plate is fixed to said metal extruded casing to cover said second opening by screws.

12. A heat-dissipating casing of an electronic apparatus having an input device, an output device, and a printed circuit board connected with said input device and said output device, and a printed circuit board connected with said input device and said output device, comprising:
   a metal extruded casing having at least four surfaces to form a space, a first opening and a second opening, wherein said space is provided for receiving said printed circuit board;
   a first side plate fixed to said metal extruded casing to cover said first opening and having a first hole for securing said input device;
   a second side plate fixed to said metal extruded casing to cover said second opening and having a second hole for securing said output device;
   at least one cover covering a part of said metal extruded casing for preventing a user from directly touching said electronic apparatus and being hurt by the heat generated from said electronic apparatus; and
   wherein said cover comprises at least one fixing element for fixing to said metal extruded casing in a removable manner, said fixing element is a spring piece for biasing against said surface of said metal extruded casing.

13. The heat-dissipating casing according to claim 12 wherein said cover is made of plastic.

14. The heat-dissipating casing according to claim 12 wherein said cover has plural heat-dissipating holes.

15. The heat-dissipating casing according to claim 12, wherein said metal extruded casing is made of aluminum or copper.

* * * * *